(12) United States Patent
Kelly et al.

(10) Patent No.: US 7,870,522 B1
(45) Date of Patent: Jan. 11, 2011

(54) EFFICIENT COMMUNICATION OF DATA BETWEEN BLOCKS IN A HIGH LEVEL MODELING SYSTEM

(75) Inventors: Sean A. Kelly, Boulder, CO (US); Roger B. Milne, Boulder, CO (US); Jonathan B. Ballagh, Boulder, CO (US)

(73) Assignee: Xilinx, Inc., San Jose, CA (US)

( * ) Notice: Subject to any disclaimer, the term of this patent is extended or adjusted under 35 U.S.C. 154(b) by 518 days.

(21) Appl. No.: 12/043,284

(22) Filed: Mar. 6, 2008

Related U.S. Application Data

(62) Division of application No. 11/268,832, filed on Nov. 8, 2005, now Pat. No. 7,366,998.

(51) Int. Cl.
*G06F 17/50* (2006.01)
*G06F 9/45* (2006.01)

(52) U.S. Cl. .................................. 716/4; 716/3; 716/5
(58) Field of Classification Search .................. 716/3–5
See application file for complete search history.

(56) References Cited

U.S. PATENT DOCUMENTS

| | | | |
|---|---|---|---|
| 6,691,301 | B2 | 2/2004 | Bowen |
| 7,036,106 | B1 | 4/2006 | Wang et al. |
| 7,194,705 | B1 | 3/2007 | Deepak et al. |
| 2005/0198606 | A1 | 9/2005 | Gupta et al. |
| 2005/0229170 | A1 | 10/2005 | Bellantoni et al. |
| 2006/0230377 | A1 | 10/2006 | Rapp et al. |

OTHER PUBLICATIONS

Hines et al.; "Dynamic Communication Models in Embedded System Co-Simulation"; 1997; Department of COmputer Science and Engineering at University of Washington; pp. 1-6.*
Smith et al.; "The Contract Net Protocol: High-Level Communication and Control in a Distributed Problem Solver"; Dec. 1980; IEEE Transactions on Computers, vol. C-29, No. 12; pp. 1-10.*

* cited by examiner

*Primary Examiner*—Jack Chiang
*Assistant Examiner*—Suresh Memula
(74) *Attorney, Agent, or Firm*—LeRoy D. Maunu

(57) ABSTRACT

A method communicates data with efficient conversion between representations in a high-level modeling system. The data is communicated from a first block in a first external format and the data is communicated to a second block in a second external format. The first block has a first internal representation of the data and the second block has a second internal representation of the data. The first internal representation is converted to the second internal representation without intermediate representation in the first and second external formats in response to different first and second external formats or different first and second internal representations. Conversion between the representations of the data is bypassed in response to like first and second external formats and like first and second internal representations. A signal instance is created that communicates the data between the blocks. Converters between data representations are installed in the signal instance on demand.

11 Claims, 5 Drawing Sheets ical resources needed to simulate an electronic design. Effi-
EFFICIENT COMMUNICATION OF DATA BETWEEN BLOCKS IN A HIGH LEVEL MODELING SYSTEM

FIELD OF THE INVENTION

The present invention generally relates to simulation of an electronic design in a high level modeling system.

BACKGROUND

A designer may use a high-level modeling system (HLMS), such as System Generator available from Xilinx Inc., to develop and simulate an electronic design. Typically, a designer develops an electronic design by selecting functional blocks from a library of functional blocks and interconnecting the functional blocks with signals. During simulation of the electronic design in the HLMS, data is transferred on the signals between the functional blocks of the electronic design.

Data transferred on signals between functional blocks may have many possible formats and representations. Typically, the functional blocks from the library may support a wide variety of configurable formats to represent the data externally transmitted and received on signals connected to the functional block, with a specific external format selected by the designer during development of the electronic design. Each functional block may have a corresponding simulation model that uses an internal representation for the data, and these internal representations are typically selected from the limited number of intrinsic data types available in the software language, such as C, C++, or MATLAB m-code, used to specify the simulation model.

During simulation of an electronic design in a HLMS, data transferred by signals of the electronic design may need to be converted between the various external formats and internal representations for the data. The conversion of the data between the various external formats and internal representations may consume a significant portion of the computational resources needed to simulate an electronic design. Efficient conversion between data representations may improve simulation performance.

The present invention may address one or more of the above issues.

SUMMARY OF THE INVENTION

Various embodiments of the invention provide a method for communicating data in a high level modeling system (HLMS) of a computing system. An electronic design is created in a memory arrangement of the computing system for the HLMS. The electronic design includes a signal that communicates the data from a first block to a second block. The data is communicated from the first block in a first external format and the data is communicated to the second block in a second external format. A simulation model is generated for the electronic design in the memory arrangement of the computing system for the HLMS. The simulation model has a first internal representation of the data in the first block, and a second internal representation of the data in the second block. The first internal representation is converted to the second internal representation without an intermediate representation in the first and second external formats in response to at least one of different first and second external formats or different first and second internal representations. Conversion between the representations of the data is bypassed in response to like first and second external formats or like first and second internal representations or both.

Various other embodiments of the invention provide a method for communicating data during simulation of an electronic design in a high level modeling system (HLMS) of a computing system. A signal instance is created that communicates the data from a first block to at least one block including a second block during simulation of a simulation model in the HLMS of the computing system. The simulation model has a first internal representation for the data in the first block and a second internal representation for the data in the second block. A first storage area in the signal instance is updated with the data produced in the first internal representation by the first block. The data is requested by the second block. A converter is installed in the signal instance that converts the data from the first internal representation to the second internal representation without intermediate storage in another representation in response to a corresponding converter not already being installed. For each converter that is installed in the signal instance, a respective second storage area in the signal instance is updated with the data from the first storage area converted to a corresponding internal representation. A pointer to the data in the second internal representation is provided to the second block.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which.

DETAILED DESCRIPTION

Figure 1:
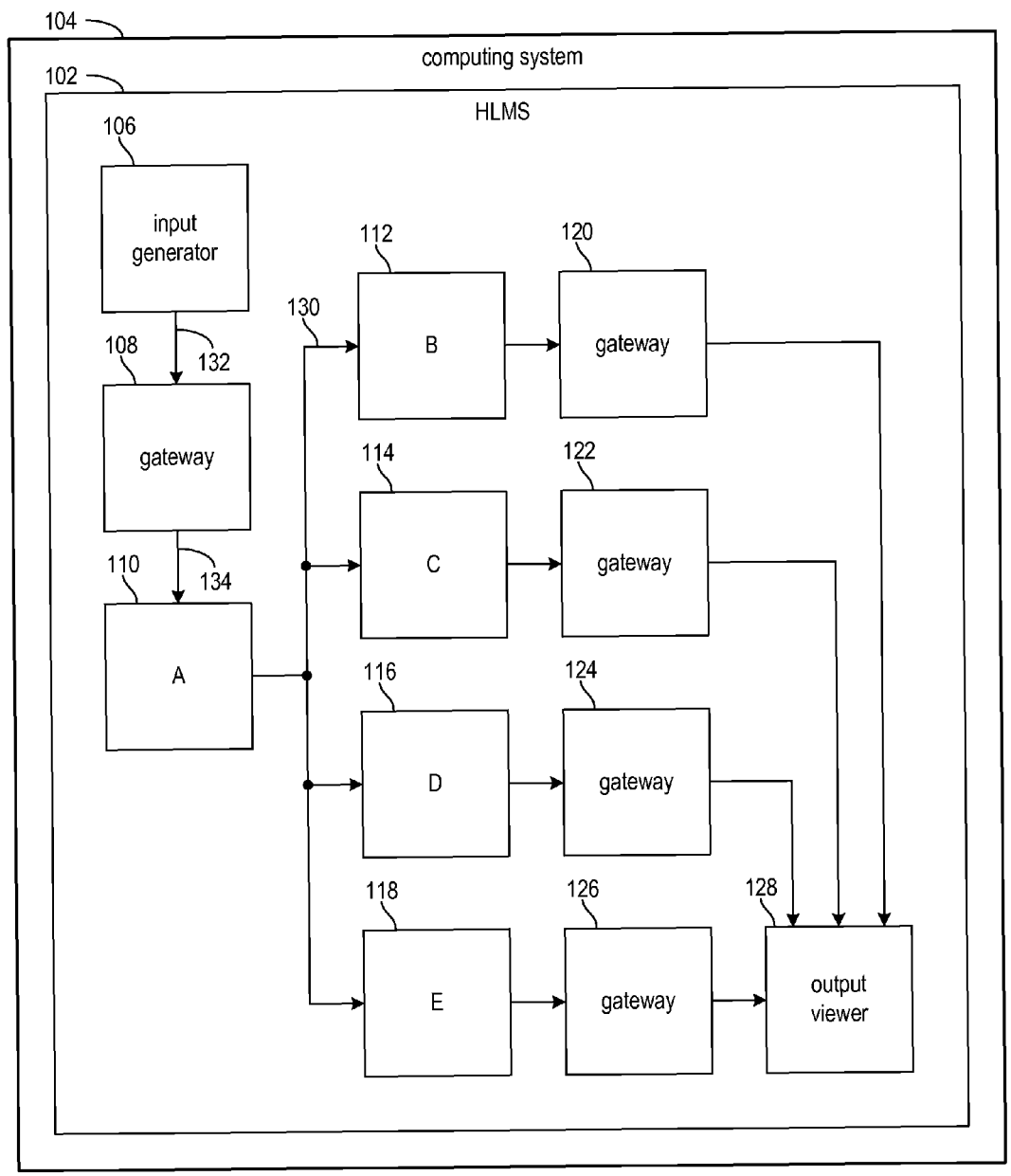
FIG. 1 is a block diagram of an example electronic design in a HLMS of a computing system in accordance with various embodiments of the invention.

FIG. 1 is a block diagram of an example electronic design in a HLMS 102 of a computing system 104 in accordance with various embodiments of the invention. The blocks 106 through 128 shown in FIG. 1 may be those displayed by a user interface of the HLMS 102 used by a designer to create and simulate the electronic design. The design may include blocks 110 through 118, for example. During simulation of the electronic design in the HLMS 102, a signal 130 communicates data from driver block-A 110 to blocks 112, 114, 116, and 118.

An example HLMS 102 is the System Generator HLMS available from Xilinx, Inc. The HLMS may have an input generator 106 that generates input data on line 132 in a default format of double precision floating point and an output viewer 128 that displays output data received in the default format. Gateway 108 may convert the default external format on line 132 to another external format on line 134. Configuration of gateway 108 may allow a user of HLMS 102 to select the external format provided to line 134. Example external formats include a Boolean representation, signed and unsigned integer representations having a user configurable width, signed and unsigned fixed-point representations, and various floating-point representations. The fixed-point representations may have a user configurable width and a user configurable precision. Gateways 120 through 126 may convert the outputs from blocks 112 through 118 into the default format accepted by output viewer 128.

The external formats used for the data transferred by the signals of an electronic design may be specified by a designer during development of the electronic design in HLMS 102. An HLMS 102 may have the ability to propagate the external formats for the signals in the design from a few designer-specified sources, such as gateway 108. Omitting the requirement that the designer specify the external format used by every signal of an electronic design may increase designer productivity because the designer may focus on the high-level architecture of the electronic design without being distracted by low-level implementation details.

Block-A 110 may be a flexible block that adapts to the external format provided to line 134 by gateway 108. For example, block-A 110 may output an external format on line 130 that matches the external format provided to line 134 by gateway 108. In another example, block-A 110 may instead be a specific-purpose block that receives data from line 134 in a particular external format that may be different from the external format provided to line 134 by gateway 108. Similarly, block-A 110 may drive data to the signal on line 130 in an external format that is different from the external format received from line 130 by block-E 118, while block-B 112 may receive the data from line 130 in an external format that matches the external format driven by block-A 110.

In addition to the external formats driven and received on signals, such as the signal on line 130, each block may internally store input data received and output data driven using an internal representation. The external format for signals may be explicitly or implicitly specified by a user of the HLMS 102. The internal representation within a block, such as blocks 110 through 118 of the electronic design, may be determined by the simulation model for the block and the programming language used to implement the simulation model. The internal representation for data received from a signal or driven to a signal by a block may be an intrinsic data type of the programming language used to implement the simulation model. It will be appreciated that such an internal representation may be a more complex data type, such as an array with one or more dimensions and other data structures.

Various embodiments of the invention communicate data, for example, from block-A 110 to block-B 112 using the signal on line 130, without conversion between representations and formats when the external formats and internal representations are identical. When either or both of the external formats and internal representations are different, various embodiments of the invention communicate data between the blocks using a single-step conversion that converts the data directly between the internal formats. The single-step conversion generally does not store data in an intermediate representation, such as the external formats of the blocks.

Figure 2:
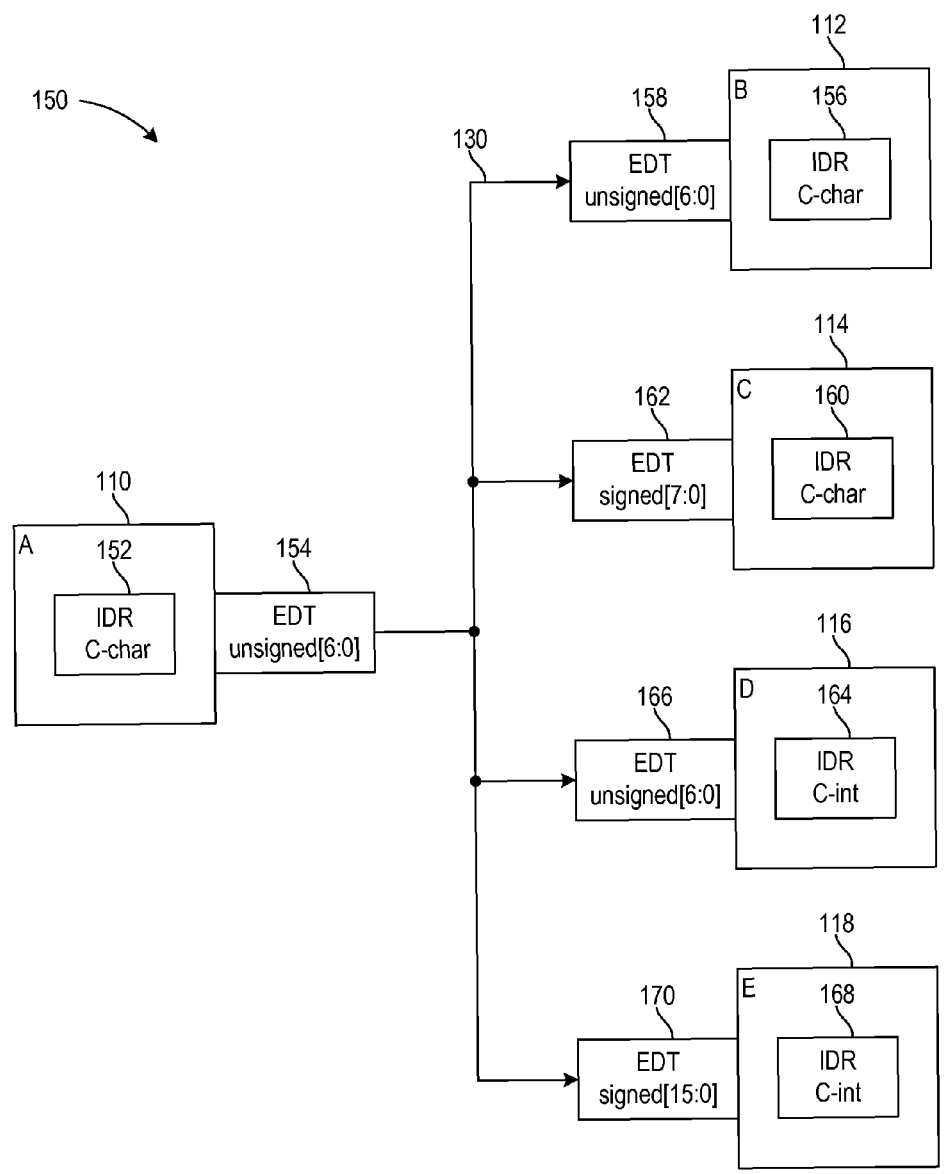
FIG. 2 is a block diagram of an example electronic design illustrating external formats and internal representations for data communicated by a signal during simulation of the electronic design in accordance with various embodiments of the invention.

FIG. 2 is a block diagram of an example electronic design 150 illustrating external formats and internal representations for data communicated by a signal 130 during simulation of the electronic design in accordance with various embodiments of the invention. Block-A 110 drives data that is communicated via signal 130 to blocks 112, 114, 116, and 118.

Block-A 110 may be implemented in the C programming language and stores the data driven on signal 130 in a declared variable having an internal representation 152, which has an internal data representation (IDR) of a "char" type in the C programming language. The declared variable with internal representation 152 may be stored in a memory arrangement of the computer system for a HLMS. Block-A 110 may be specified by a user of the HLMS to drive data on signal 130 using an external format 154, which has an external data type (EDT) of an unsigned 7-bit integer. Various embodiments of the invention communicate the data from block-A 110 to blocks 112, 114, 116, and 118 without an intermediate representation of the data in external format 154.

Block-B 112 may be implemented in the C++ programming language and stores the data received from signal 130 in a declared variable having internal representation 156 that is a "char" type in the C++ programming language. Block-B 112 may be specified by a user of the HLMS to receive data from signal 130 in an external format 158 that is an unsigned 7-bit integer. Because the internal representations 152 and 156 are identical and the external formats 154 and 158 are also identical, communication of the data from block-A 110 to block-B 112 may be accomplished by directly copying the data from internal representation 152 to internal representation 156. Conversion of the data is not needed and may be bypassed.

Block-C 114 may store the data received from signal 130 in internal representation 160 that is a "char" type in the C programming language. Block-C 114 may be specified by a user of the HLMS to receive data from signal 130 in an external format 162 that is a signed 8-bit integer. Because the external formats 154 and 162 are different, conversion may be necessary even though the internal representations 152 and 160 are identical. The conversion may be accomplished without an intermediate representation of the data by setting the internal representation 160 to the result from masking the most significant bit (the sign bit) of the internal representation 152.

Generally for proper operation of the electronic design 150, the different external formats 154 and 162 should be compatible formats. Usually, compatible formats have a width of the external format 162 receiving the data from the signal 130 that is greater than or equal to the width of the external format 154 providing the data to the signal 130. However, an external format of a double precision floating point may be specified as compatible with any external format.

Block-D 116 may store the data received from signal 130 in internal representation 164 that is an "int" type in the C programming language. Block-D 116 may be specified by a user of the HLMS to receive data from signal 130 in an external format 166 that is an unsigned 7-bit integer. Because the internal representations 152 and 164 are different, conversion may be necessary even though the external formats 154 and 166 are identical. The conversion may be accomplished without an intermediate representation of the data by setting the internal representation 164 to the result of a "type cast" of the internal representation 152 to a type of "int".

Block-E 118 may store the data received from signal 130 in internal representation 168 that is an "int" type in the C programming language. Block-E 118 may be specified by a user of the HLMS to receive data from signal 130 in an external format 170 that is a signed 16-bit integer. Because the external formats 154 and 170 are different and because the internal representations 152 and 168 are different, conversion may be necessary. The conversion may be accomplished without an intermediate representation of the data by setting the internal representation 168 to the result of a "type cast" of the internal representation 152 to a type of "int" and masking the nine most significant bits.

Figure 3:
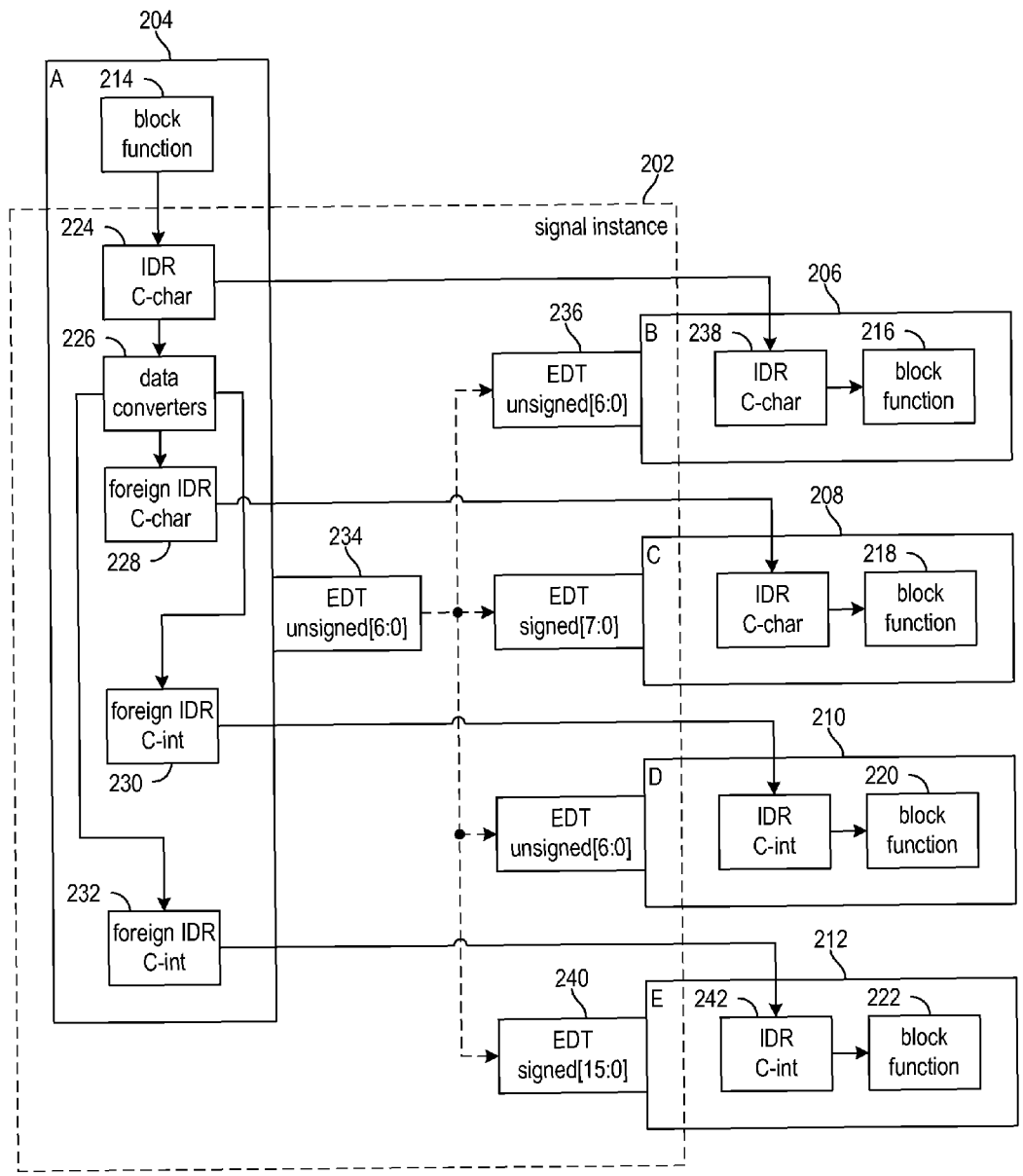
FIG. 3 is a block diagram of an example electronic design illustrating communication between blocks of the electronic design using a signal instance in accordance with various embodiments of the invention.

FIG. 3 is a block diagram of an example electronic design illustrating communication between blocks of the electronic design using a signal instance 202 in accordance with various embodiments of the invention. The functions of the signal instance 202 and signal instances for other signals in the electronic design may be provided during simulation by a respective instance of an object-oriented class. The public interface for the object-oriented class may include a constructor, an initialization method, an update method to update the communicated data, and an overloaded get method to obtain the communicated data in various internal representations. An example public interface for the object-oriented class of signal instance 202 in the C++ programming language is:

XSignal ( )
Default constructor.
XSignal (const XHandle::handle_t &handle)
void initialize (const SignalType &signal_type, const SignalRep &signal_rep)
void update ( )
template<typename T> T* get( )
template< > char* get( )
template< > int* get( )

The XSignal( ) constructor for the object-oriented class may be used to create signal instances, such as signal instance 202, during initialization of a simulation. Also during initialization of the simulation, the initialize( ) method may set a signal instance to a specified initial value. The public interface is further explained in the following paragraphs.

Each block 204, 206, 208, 210, and 212 may have a respective block function 214, 216, 218, 220, and 222 that generates the outputs of the block from the inputs to the block. The methods of the signal instance 202 are executed along with block functions 214, 216, 218, 220, and 222 to simulate the electronic design. The signal instance 202 may be created during initialization of the simulation by an invocation of a constructor for the object-oriented class.

An update method is provided by the object-oriented class of signal instance 202 and permits the block function 214 of block-A 204 to update the data driven by block-A 204. The update method has no parameters because, for example, the signal instance 202 provides sufficient state information to determine the converters to need to be invoked. The update method stores the data being driven by block-A 204 in storage area 224 of signal instance 202 using the internal representation of block-A 204 for the data. In addition, the update method converts the data using the converters 226 that are currently installed and stores converted data in corresponding storage areas 228, 230, and 232 of signal instance 202. Each of the converters 226 is installed at the first invocation of the get method requesting a corresponding conversion of the communicated data. For example, block function 222 of block-E 212 may invoke the get method to request the communicated data in an internal representation of an "int" type in the C programming language, and the first invocation of the get method by block function 222 may install a corresponding converter in converters 226. Converters 226 may be a list of function pointers and installing a converter in converters 226 may include adding the converter to the list of function pointers.

An overloaded get method is provided by the object-oriented class of signal instance 202 and permits the block functions 216, 218, 220, and 222 to obtain the data driven by block-A 204 in the appropriate internal representation. Because the internal representations of block-A 204 and block-B 206 are identical and the external formats 234 and 236 for these blocks are also identical, no conversion of the data is needed and the get method returns a pointer to storage area 224. The block function 216 may dereference the pointer to obtain the data driven by block-A 204. The block function 216 may store the communicated data locally in storage 238 having the internal representation for block-B 206.

Block function 222 of block-E 212 may obtain the communicated data driven by block-A 204 using another template of the overloaded get method. For the first invocation of the get method by block function 222, the data may or may not be already appropriately converted. The data may already be converted if another block requiring the same type of conversion has already invoked the get method for the signal instance 202. The get method checks whether the appropriate converter for the data communicated from block-A 204 to block-E 212 is already installed in converters 226. If the converter for the combination of internal representations of block-A 204 and block-D 212 and external formats 234 and 240 is installed, then storage 232 already contains the converted data and the get method returns a pointer to storage 232. The block function 222 may dereference the pointer to obtain the data driven by block-A 204. The block function 222 may store the communicated data locally in storage 242 having the internal representation for block-E 212. If the appropriate converter is not installed, then the get method adds the converter to the installed converters 226, and the storage 232 is updated by converting the current data in storage 224.

Figure 4:
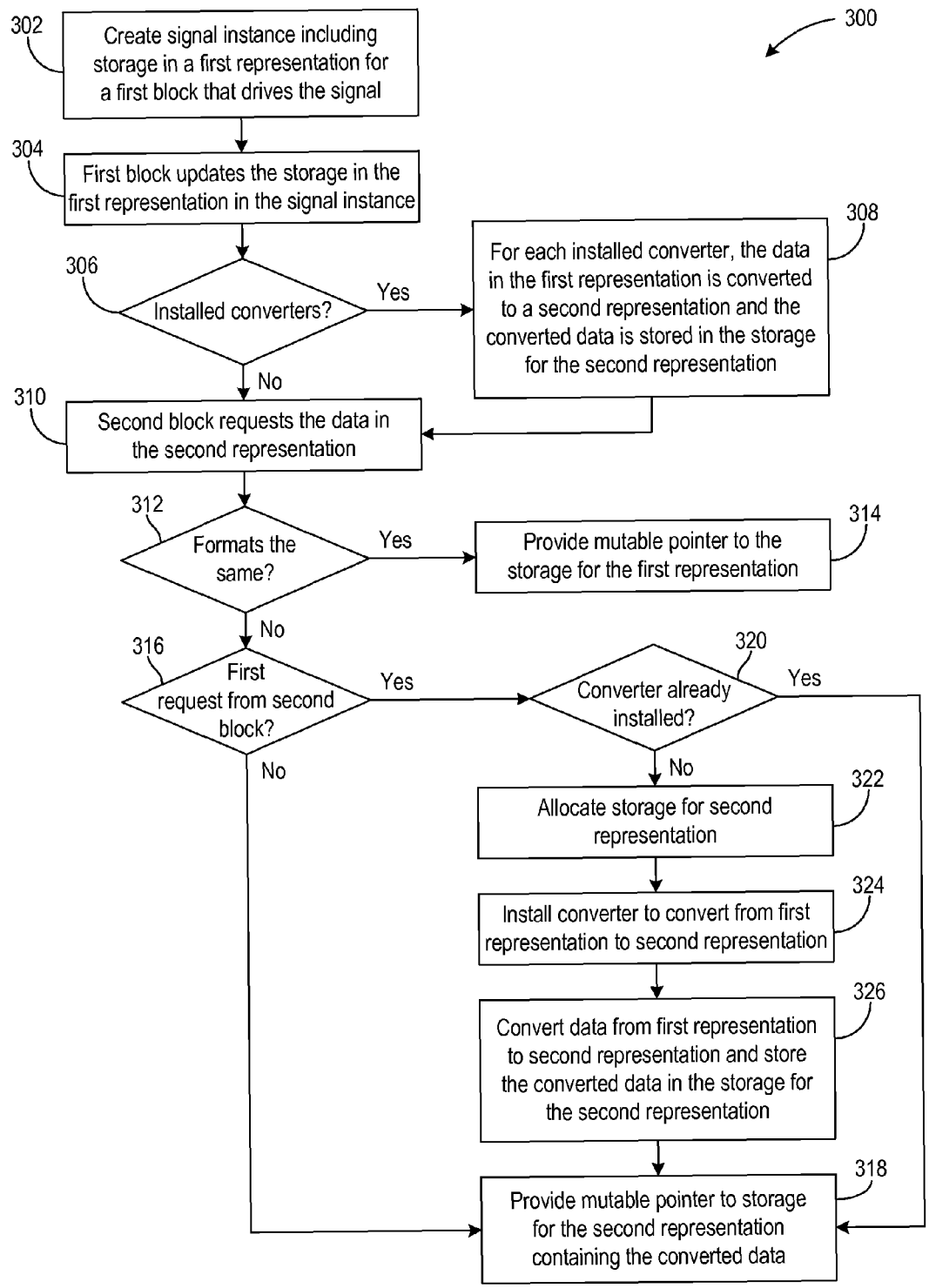
FIG. 4 is a flow diagram of a process for communicating data by a signal instance during simulation of an electronic design in accordance with various embodiments of the invention.

FIG. 4 is a flow diagram of a process 300 for communicating data by a signal instance during simulation of an electronic design in accordance with various embodiments of the invention. The data is communicated from a first block to at least a second block of the simulation model for an electronic design.

At step 302, a signal instance is created that includes storage in a first representation for the data driven by the first block. The signal instance may be an instance of an object-oriented class and a constructor for the object-oriented class may create the signal instance during initialization of the simulation. Creating the signal instance may include allocating the storage for the data driven by the first block. During simulation at step 304, the first block updates the storage in the first representation in the signal instance with the data being communicated to the second block. If there are installed converters present (decision 306), then for each installed converter, the data in the first representation is converted to a second representation, and the result is stored in corresponding storage for the second representation at step 308. An update method for an object-oriented class of the signal instance may perform steps 304 through 308.

At step 310, the second block requests the data being communicated in the second representation. A get method for an object-oriented class of the signal instance may perform steps 310 through 326. Decision 312 checks whether the internal representations of the first and second block are alike and the external formats in the electronic design for the communicated data are also alike. Conversion of the data and copying of the data may be bypassed if the internal representations and external formats are alike, and then process 300 proceeds to step 314; otherwise, process 300 proceeds to decision 316. At step 314, a mutable pointer to the storage for the first representation is provided to the second block. The second block may use the pointer to read the communicated data in the second representation.

Decision 316 checks whether the request from the second block is the first request from the second block. If the request is not the first request, then the appropriate converter has already been installed, and process 300 proceeds to step 318. At step 318, a mutable pointer to the storage for the appropriate second representation is provided to the second block. If the request is not the first request at decision 316, process 300 proceeds to decision 320. Decision 320 checks whether the appropriate converter is already installed. The appropriate converter may already be installed when another block has previously requested the data from the first block in the same combination of internal representations and external formats. If the appropriate converter is installed already, process 300 proceeds to step 318, and otherwise process 300 proceeds to step 322.

At step 322, storage is allocated in the signal instance for the data in the second representation. In addition, other conversion resources may be allocated at step 322, such as storage for a list of function pointers for the installed converters. Because the conversion resources are associated with the signal instance, the conversion resources have the same "lifetime" as the signal instance. At step 324, the converter for the combination of internal representations and external formats is installed. Installing the converter may include adding the converter to a list of installed converters. At step 326, the storage allocated at step 322 is initialized with the current data converted by the converter installed at step 324 from the first representation to the second representation, and the result is stored in the storage for the second representation. At step 318, a mutable pointer is provided to the storage for the second representation. A get method for an object-oriented class of the signal instance may perform steps 310 through 326, with the get method returning the appropriate mutable pointer at either step 314 or step 318.

Figure 5:
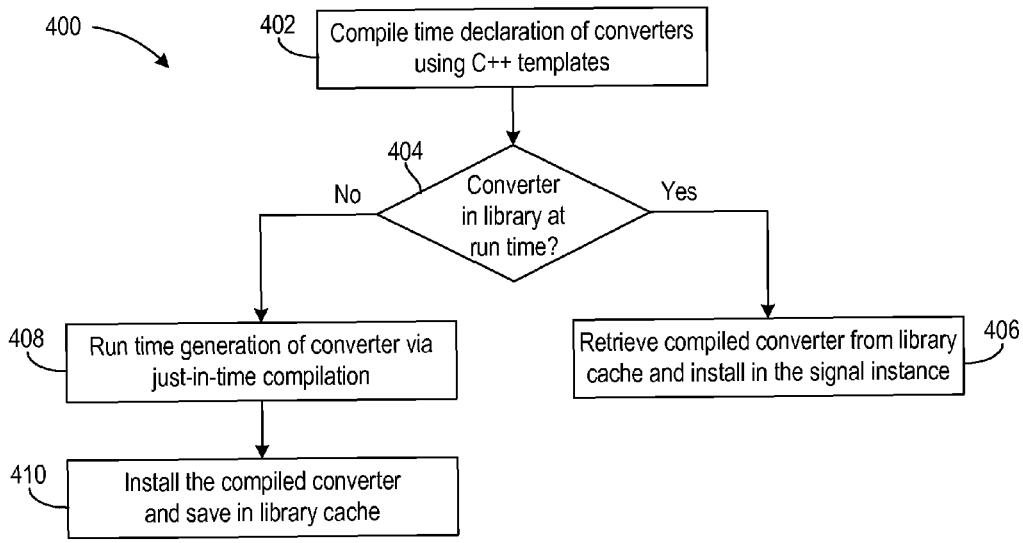
FIG. 5 is a flow diagram of a process for installing a converter during simulation of an electronic design in accordance with various embodiments of the invention.

FIG. 5 is a flow diagram of a process for installing a converter during simulation of an electronic design in accordance with various embodiments of the invention. Conversion of data communicated between blocks may use converters that are dynamically installed during simulation when conversion is needed for the communicated data.

At step 402, converters are declared at compile time of the simulation model used to simulate an electronic design. The converters may use an overloaded convert method of an object-oriented class in the C++ programming language. In one embodiment, the convert method returns a pointer to the appropriate internal representation of the communicated data. C++ templates may be used to declare a convert method template for each of the internal representations that may be returned by the overloaded convert method. An example public interface for the object-oriented class for the overloaded convert method in the C++ programming language is:

template<typename T> T* convert( )
    template< > char* convert( )
    template< > int* convert( )

A library cache may be maintained containing previously compiled conversions functions for various combinations of internal representations and external formats. At run time of the simulation model, a second block may request data communicated from a first block. For the first such request by the second block, the appropriate converter may need to be installed in a signal instance. When a converter needs to be installed in a signal instance, the library cache is checked for the compiled version of the converter for the combination of internal representations of the first and second block and the external formats of the first and second block in the electronic design. If the compiled version of the converter is available in the library cache, process 400 proceeds from decision 404 to step 406; otherwise, process 400 proceeds from decision 404 to step 408.

At step 406, the compiled converter is retrieved from the library cache and installed in the signal instance. The same instance of the compiled converter may be installed in another signal instance for each retrieval from the library cache at step 406.

If the compiled converter is not available, then at step 408, the source code for the converter is generated for the combination of internal representations and external formats, and the source code is compiled using just-in-time compilation.

In one embodiment, C programming language code is generated for the specific conversion function that is needed. The compiled converter is installed in the signal instance and saved in the library cache at step 410.

Figure 6:
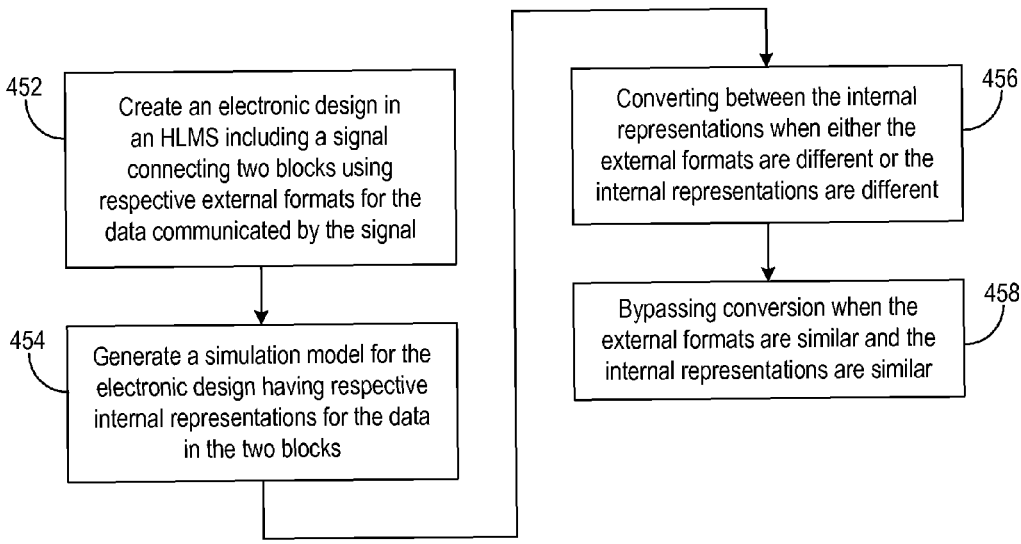
FIG. 6 is a flow diagram of a process for communicating data between blocks during simulation of an electronic design in accordance with various embodiments of the invention.

FIG. 6 is a flow diagram of a process for communicating data between blocks during simulation of an electronic design in accordance with various embodiments of the invention.

At step 452 an electronic design is created in a memory arrangement of the computing system for a HLMS. The electronic design includes a signal that communicates the data from a first block to a second block. The signal communicates the data from the first block in a first external format and the signal communicates the data to the second block in a second external format. At step 454 a simulation model is generated for the electronic design in the memory arrangement of the computing system for the HLMS. The simulation model has a first internal representation of the communicated data in the first block, and a second internal representation of the communicated data in the second block.

At step 456, when either the first and second external formats are different or the first and second internal representations are different, the first internal representation is converted to the second internal representation without an intermediate representation in another representation or format, such as the first and second external formats. At step 458, conversion between the representations of the data is bypassed when the first and second external formats are alike and the first and second internal representations are alike. Bypassing conversion at step 458 and directly converting at step 456 without an intermediate representation may increase the efficiency of communicating data between blocks during simulation of the electronic design. The improved efficiency of communicating data may increase the speed of simulation of the electronic design.

Those skilled in the art will appreciate that various alternative computing arrangements, including one or more processors and a memory arrangement configured with program code, would be suitable for hosting the processes and data structures of the different embodiments of the present invention. In addition, the processes may be provided via a variety of computer-readable media or delivery channels such as magnetic or optical disks or tapes, electronic storage devices, or as application services over a network.

The present invention is thought to be applicable to a variety of systems for simulating an electronic design. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A method for communicating data during simulation of an electronic design in a high level modeling system (HLMS) executing on a computing system, comprising:
   creating a signal instance communicating the data from a first block to at least one block including a second block during simulation of a simulation model in the HLMS, the simulation model having a first internal representation for the data in the first block and a second internal representation for the data in the second block;
   updating a first storage area in the signal instance with the data produced in the first internal representation by the first block;
   requesting the data by the second block;
   installing a converter in the signal instance in response to a corresponding converter not already being installed, the converter adapted to convert the data from the first internal representation to the second internal representation without intermediate storage in another representation;
   for each converter that is installed in the signal instance, updating a respective second storage area in the signal instance with the data from the first storage area converted to an internal representation output by the converter; and
   providing a pointer to the data in the second internal representation to the second block.

2. The method of claim 1, wherein the electronic design outputs the data in a first external format from the first block and inputs the data in a second external format to the second block.

3. The method of claim 2, wherein providing the pointer to the data includes providing a pointer to the first storage area in response to like first and second external formats and like first and second internal representations.

4. The method of claim 2, wherein providing the pointer to the data includes providing a pointer to one of the second storage areas that has the second internal representation in response to at least one of the first and second external formats being different and the first and second internal representations being different.

5. The method of claim 2, wherein the installation of the converter is further in response to at least one of the first and second external formats being different and the first and second internal representations being different.

6. The method of claim 1, wherein the installation of the converter is further in response to the requesting of the data by the second block.

7. The method of claim 1, wherein the installation of the converter further includes allocating the respective second storage area for the converter.

8. The method of claim 1, wherein the installation of the converter includes updating the respective second storage area for the converter with the data from the first storage area converted to the corresponding internal representation for the converter.

9. The method of claim 1, wherein the installation of the converter includes generation of the converter via just-in-time compilation.

10. The method of claim 9, wherein the installation of the converter includes retrieving the converter from a library cache of converters generated via just-in-time compilation.

11. The method of claim 1, wherein the updating the respective second storage area for each converter that is installed is in response to the updating of the first storage area by the first block.

* * * * *